(12) United States Patent
Hossain et al.

(10) Patent No.: US 12,041,775 B2
(45) Date of Patent: *Jul. 16, 2024

(54) ELECTRONIC DEVICES COMPRISING MEMORY PILLARS AND DUMMY PILLARS INCLUDING AN OXIDE MATERIAL, AND RELATED SYSTEMS AND METHODS

(71) Applicant: Micron Technology, Inc., Boise, ID (US)

(72) Inventors: S M Istiaque Hossain, Boise, ID (US); Tom J. John, Boise, ID (US); Darwin A. Clampitt, Wilder, ID (US); Anilkumar Chandolu, Boise, ID (US); Prakash Rau Mokhna Rau, Boise, ID (US); Christopher J. Larsen, Boise, ID (US); Kye Hyun Baek, Boise, ID (US)

(73) Assignee: Lodestar Licensing Group LLC, Evanston, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/933,227

(22) Filed: Sep. 19, 2022

(65) Prior Publication Data

US 2023/0017241 A1 Jan. 19, 2023

Related U.S. Application Data

(63) Continuation of application No. 16/937,303, filed on Jul. 23, 2020, now Pat. No. 11,482,536.

(51) Int. Cl.
*H10B 43/27* (2023.01)
*H01L 21/768* (2006.01)

(52) U.S. Cl.
CPC ....... *H10B 43/27* (2023.02); *H01L 21/76802* (2013.01); *H01L 21/76877* (2013.01); *H01L 21/76897* (2013.01)

(58) Field of Classification Search
CPC ......... H01L 27/11582; H01L 21/76897; H01L 21/76802; H01L 21/76877
See application file for complete search history.

(56) References Cited

U.S. PATENT DOCUMENTS 9,620,519 B2 4/2017 Baba et al.
9,780,036 B2 10/2017 Lee et al.
(Continued)

FOREIGN PATENT DOCUMENTS

CN 109427805 A 3/2019
CN 109427811 A 3/2019
(Continued)

OTHER PUBLICATIONS

International Search Report for Application No. PCT/US2021/041463, mailed Nov. 2, 2021, 3 pages.
(Continued)

*Primary Examiner* — Karen Kusumakar
(74) *Attorney, Agent, or Firm* — TraskBritt

(57) ABSTRACT

An electronic device comprising lower and upper decks adjacent to a source. The lower and upper decks comprise tiers of alternating conductive materials and dielectric materials. Memory pillars in the lower and upper decks are configured to be operably coupled to the source. The memory pillars comprise contact plugs in the upper deck, cell films in the lower and upper decks, and fill materials in the lower and upper decks. The cell films in the upper deck are adjacent to the contact plugs and the fill materials in the upper deck are adjacent to the contact plugs. Dummy pillars are in a central region of the lower deck and the upper deck. The dummy pillars comprise an oxide material in the upper deck, the oxide material contacting the contact plugs and the fill materials. Additional electronic devices and related systems and methods are also disclosed.

20 Claims, 5 Drawing Sheets

(56) References Cited

U.S. PATENT DOCUMENTS

| | | |
|---|---|---|
| 10,276,590 B2 | 4/2019 | Hamada et al. |
| 10,553,604 B2 | 2/2020 | Lu et al. |
| 10,593,690 B2 | 3/2020 | Lu et al. |
| 11,482,536 B2* | 10/2022 | Hossain ............ H01L 21/76802 |
| 2011/0065270 A1 | 3/2011 | Shim et al. |
| 2013/0215684 A1 | 8/2013 | Oh et al. |
| 2015/0340377 A1 | 11/2015 | Lee |
| 2016/0064409 A1 | 3/2016 | Yaegashi |
| 2016/0315097 A1 | 10/2016 | Hsu |
| 2016/0343726 A1 | 11/2016 | Yune |
| 2017/0352552 A1 | 12/2017 | Lee |
| 2019/0067182 A1* | 2/2019 | Lee ....................... H01L 23/528 |
| 2019/0067321 A1* | 2/2019 | Song ...................... H10B 43/35 |
| 2019/0074290 A1 | 3/2019 | Xiao et al. |
| 2019/0181152 A1 | 6/2019 | Choi |
| 2019/0319045 A1 | 10/2019 | Choi et al. |
| 2019/0371382 A1 | 12/2019 | Futatsuyama |
| 2020/0075617 A1 | 3/2020 | Saxler |
| 2020/0091167 A1 | 3/2020 | Lee |

FOREIGN PATENT DOCUMENTS

| | | |
|---|---|---|
| CN | 110137179 A | 8/2019 |
| CN | 110600476 A | 12/2019 |

OTHER PUBLICATIONS

Taiwanese Search Report and Office Action from Taiwanese Application No. 110123952, dated Jul. 13, 2022, 33 pages with English translation.

Written Opinion of the International Searching Authority for Application No. PCT/US2021/041463, mailed Nov. 2, 2021, 6 pages.

* cited by examiner

ELECTRONIC DEVICES COMPRISING MEMORY PILLARS AND DUMMY PILLARS INCLUDING AN OXIDE MATERIAL, AND RELATED SYSTEMS AND METHODS

CROSS-REFERENCE TO RELATED APPLICATION

This application is a continuation of U.S. patent application Ser. No. 16/937,303, filed Jul. 23, 2020, now U.S. Pat. No. 11,482,536, issued Oct. 24, 2022, the disclosure of which is hereby incorporated herein in its entirety by this reference.

TECHNICAL FIELD

Embodiments disclosed herein relate to electronic devices and electronic device fabrication. More particularly, embodiments of the disclosure relate to electronic devices including memory pillars and dummy pillars, where the dummy pillars include an oxide material, and to related systems and methods.

BACKGROUND

Memory devices provide data storage for electronic systems. A Flash memory device is one of various memory device types and has numerous uses in modern computers and other electrical devices. A conventional Flash memory device includes a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional NAND (3D NAND) memory device, a type of vertical memory device, not only are the memory cells arranged in row and column fashion in a horizontal array, but tiers of the horizontal arrays are stacked (e.g., vertically stacked) over one another to provide a three-dimensional array of the memory cells. The tiers include alternating conductive materials with insulating (e.g., dielectric) materials. The conductive materials function as control gates for, e.g., access lines (e.g., word lines) of the memory cells.

As memory density increases, the 3D NAND memory device includes two decks, with each deck including the tiers of the alternating conductive materials and dielectric materials. Vertical structures (e.g., memory pillars including channel regions) extend along the vertical string of the memory cells. A drain end of a string is adjacent one of the top and bottom of the vertical structure (e.g., memory pillar), while a source end of the string is adjacent the other of the top and bottom of the pillar. The drain end is operably connected to a bit line, while the source end is operably connected to a source. String drivers drive the access line (e.g., word line) voltages to write to or read from the memory cells of the vertical string. The 3D NAND memory devices also include other conductive materials configured to provide electrical connection between the word lines and other conductive structures of the device so that the memory cells of the memory pillars can be selected for writing, reading, and erasing operations.

To form the memory pillars, the tiers of a lower deck are patterned to form pillar openings and cell films and fill materials are formed in the pillar openings. The cell films include a channel material and cell materials. The tiers of an upper deck are formed over the lower deck and an opening is formed in a central region of the upper deck. The opening in the central region of the upper deck is subsequently filled with an oxide material. The tiers of the upper deck, with the oxide material in the central region, are then patterned to form pillar openings, cell films and fill materials are formed in the pillar openings, and contact plugs are formed over the cell films and fill materials, producing memory pillars extending through the upper and lower decks. With the oxide material in the pillars of the central region, these memory pillars function as so-called "dummy pillars." However, the dummy pillars in the central region exhibit wider critical dimensions (CDs) than the adjacent memory pillars, which causes pillar twisting and ellipticity in the central region and leads to pillar-pillar bridging and shorting of the memory pillars.

DETAILED DESCRIPTION

Figure 1:
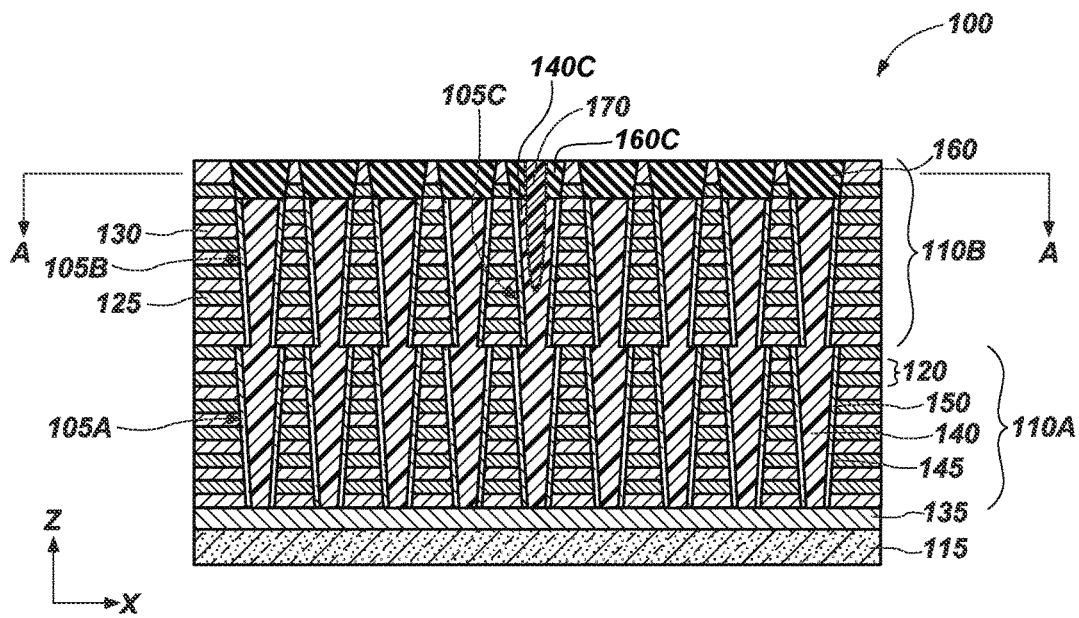
FIG. 1 is a cross-sectional view of an electronic device including memory pillars and dummy pillars according to embodiments of the disclosure.

An electronic device (e.g., an apparatus, a microelectronic device, a semiconductor device, a memory device) that includes multiple decks is disclosed, with pillars present in upper and lower decks of the electronic device. The pillars include memory pillars (e.g., channel pillars) and dummy pillars, with the memory pillars in an array region of the electronic device and the dummy pillars in a central region of the array region. The memory pillars are operably coupled (e.g., electrically connected) to a source and the dummy pillars include an oxide material that electrically isolates the dummy pillars from the source. The memory pillars are formed in the lower and upper decks of the electronic device and the oxide material is formed in the central region of the upper deck after the memory pillars are formed, making the memory pillars in the central region dummy pillars. The oxide material of the dummy pillars functions to electrically isolate one subblock (e.g., memory subblock) of the electronic device from another (e.g., an adjacent) subblock of the electronic device. The oxide material of the dummy pillars is formed in central openings (e.g., slits) in the central region and is configured as a continuous material extending between adjacent dummy pillars in the central region. By forming the oxide material of the dummy pillars after forming the memory pillars, the electronic device according to embodiments of the disclosure exhibits lower pillar twisting and ellipticity in the array region than conventional electronic devices. Critical dimensions (CDs) of the memory pillars and the dummy pillars are substantially the same as one another, unlike conventional electronic devices in which the CDs of the dummy pillars are larger than the CDs of the memory pillars.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms of the terms "a," "an," and "the" are intended to include the plural forms as well, unless the context clearly indicates otherwise.

As used herein, the term "and/or" includes any and all combinations of one or more of the associated listed items.

As used herein, the terms "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "array region" means and includes a region of an electronic device including memory cells of a memory array. The array region of the electronic device includes active circuitry.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operatively connected to each other, such as electrically connected through a direct ohmic connection or through an indirect connection (e.g., by way of another structure).

As used herein, the term "deck" means and includes multiple (e.g., two or more) tiers of alternating nitride materials and dielectric materials or alternating conductive materials and dielectric materials. Decks of the electronic device are vertically disposed relative to one another.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device includes of tiers of alternating conductive materials and dielectric materials.

As used herein, the term "electronic structure" means and includes a precursor structure to the electronic device, with tiers of alternating nitride materials and dielectric materials.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis and an indicated "Y" axis.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "selectively removable" means and includes a material that exhibits a greater removal rate responsive to process conditions, such as exposure to radiation (e.g., heat), relative to another material exposed to the same process conditions. A material that is selectively removable relative to another material is substantially completely removable without removing substantially any of the another material.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. The height of a respective material or feature (e.g., structure) may be defined as a dimension in a vertical plane.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing the electronic device (e.g., microelectronic device, semiconductor device, memory device) or the structures thereof (e.g., systems). The remainder of the process flow is known to those of ordinary skill in the art. Accordingly, only the methods and structures necessary to understand embodiments of the present electronic device and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. Unless the context indicates otherwise, the removal of materials described herein may be accomplished by any suitable technique including, but not limited to, etching (e.g., dry etching, wet etching, vapor etching), ion milling, abrasive planarization, or other known methods.

Figure 2:
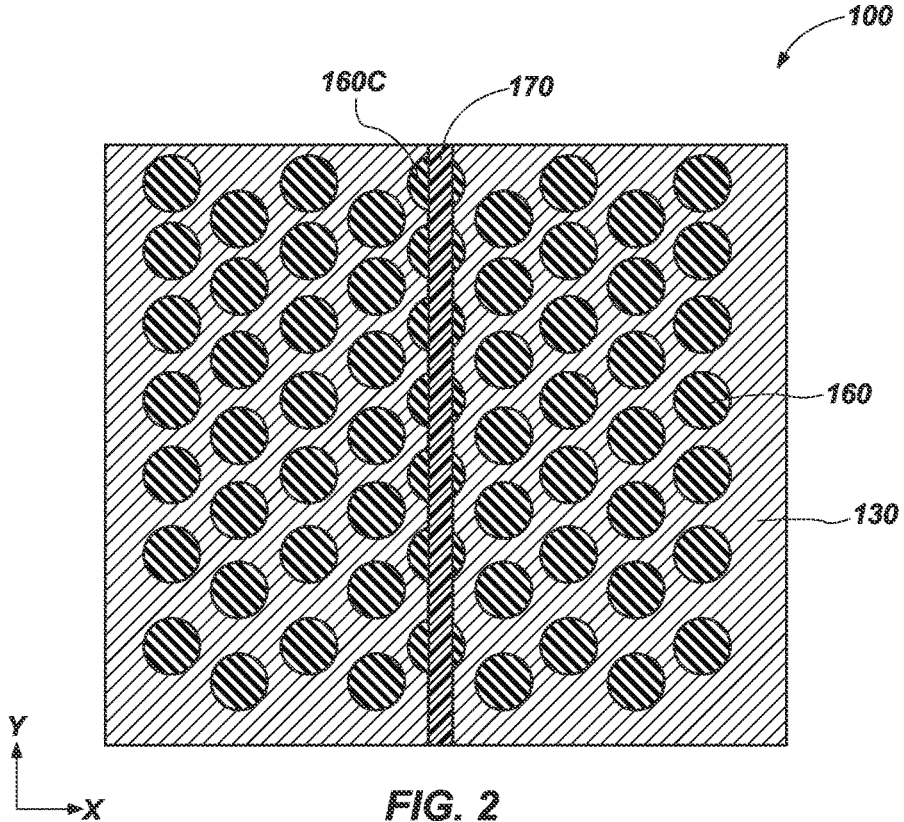
FIG. 2 is a top down view of the electronic device of FIG. 1 taken along the A-A line.

An electronic device 100 including pillars 105 (collectively referencing lower pillars 105A, upper pillars 105B, and dummy pillars 105C) in decks 110 (collectively referencing lower deck 110A and upper deck 110B) adjacent to (e.g., vertically adjacent to, on) a substrate 115 (e.g., a base material) is shown in FIGS. 1 and 2, where FIG. 2 is a top down view taken along the A-A line of FIG. 1. The electronic device 100 also includes tiers 120, conductive materials 125, dielectric materials 130, source 135, fill material 140, pillar openings 145, cell films 150, contact plugs 160, central opening 165, and oxide material 170. The pillars 105 include memory pillars 105A/105B and dummy pillars 105C. The electronic device 100 includes a lower deck 110A and an upper deck 110B, with each deck 110A, 110B including tiers 120 of alternating conductive materials 125 and dielectric materials 130. The lower deck 110A and the upper deck 110B are vertically adjacent to one another. While two decks 110A, 110B are illustrated in FIG. 1, the electronic device 100 may include a greater number of decks 110A and 110B. The lower deck 110A and the upper deck 110B may include the same number of tiers 120 as one another or a different number of tiers 120. While the lower deck 110A of the electronic device 100 of FIG. 1 includes six tiers 120, more tiers 120 or less tiers 120 may be present. The lower deck 110A and the upper deck 110B may be separated from one another by an interdeck region (not shown) between the lower deck 110A and the upper deck 110B. While not illustrated, complementary metal-oxide-semiconductor (CMOS) circuitry may, for example, be present below the substrate 115.

The pillars 105 are in pillar openings 145 in the tiers 120 of the electronic device 100. The pillar openings 145 are shown in FIG. 1 containing the cell films 150 and the fill material 140. The pillars 105 in the lower deck 110A may be referred to herein as lower pillars 105A and the pillars 105 in the upper deck 110B may be referred to herein as upper pillars 105B, while the term "pillars" 105 may be used to collectively refer to the lower pillars 105A, the upper pillars 105B, and the dummy pillars 105C. The term "memory pillars" may be used to collectively refer to the lower pillars 105A and the upper pillars 105B. The upper pillars 105B are proximal to the contact plugs 160 and the lower pillars 105A are distal to the contact plugs 160. The pillars 105 extend from an upper surface of the contact plugs 160 to an upper surface of the source 135, which is present adjacent to the substrate 115. The upper pillars 105B extend through the upper deck 110B, and the lower pillars 105A extend through the lower deck 110A and contact the source 135. The lower pillars 105A may, optionally, extend at least partially into the source 135, or may extend through the source 135 and into the substrate 115. While FIGS. 1 and 2 illustrate nine contact plugs 160 and nine pillars 105, additional contact plugs 160 and pillars 105 may be present depending on the desired configuration of the electronic device 100.

The pillars 105 in the lower deck 110A and in the upper deck 110B include a channel material and cell materials (shown collectively in FIG. 1 as the cell film 150) and the fill material 140 on sidewalls of the tiers 120. The cell film 150 of the pillars 105 extends from an upper surface of the upper deck 110B, through the upper deck 110B, through the lower deck 110A, and to a lower surface of the lower deck 110A. The fill material 140 of the pillars 105 extends through a portion of the upper deck 110B, through the lower deck 110A, and to the lower surface of the lower deck 110A. The channel material may include polysilicon or other channel material as known in the art. In some embodiments, the channel material is polysilicon. The cell materials may include one or more of a dielectric material, a conductive material, etc. The cell material(s) may include one or more of an oxide material, a storage material, or a tunnel dielectric material as known in the art. By way of example only, the cell materials may include an oxide-nitride-oxide (ONO) structure having a tunnel dielectric material, a charge trapping material, and a charge blocking material between the channel material and the dielectric materials 130 or between the channel material and the conductive materials 125. The charge trapping material may be located directly between the tunnel dielectric material and the charge blocking material. In some embodiments, the tunnel dielectric material directly contacts the channel material and the charge trapping material. The charge blocking material may directly contact and may be located directly adjacent to the charge trapping material and the dielectric materials 130 or the conductive materials 125.

The fill material 140 may be a dielectric material, such as a silicon oxide material (e.g., silicon dioxide, phosphosilicate glass, borosilicate glass, borophosphosilicate glass, fluorosilicate glass, or a combination thereof), a metal oxide material (e.g., titanium dioxide, hafnium oxide, zirconium dioxide, tantalum oxide, magnesium oxide, hafnium magnesium oxide, aluminum oxide, or a combination thereof), or a combination thereof. In some embodiments, the fill material 140 is an oxide material. The fill material 140 may substantially completely fill the pillar openings 145 in which the pillars 105 are formed. An upper surface of the fill material 140 may be substantially coplanar with an upper surface of the cell film 150. The fill material 140 separates opposing portions of the cell film 150 in the pillar openings 145.

The upper pillars 105B in the upper deck 110B also include the contact plugs 160, which are positioned over the fill material 140 and the cell film 150 of the upper pillars 105B. The contact plug 160 is formed of (e.g., includes) an electrically conductive material including, but not limited to, a metal (e.g., tungsten, titanium, nickel, tantalum, cobalt, platinum, rhodium, ruthenium, iridium, aluminum, copper, molybdenum, silver, gold, or a combination thereof), a metal alloy, a metal-containing material (e.g., a metal nitride, a metal silicide, a metal carbide, a metal oxide), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), an alloy thereof, a conductively-doped semiconductor material (e.g., conductively-doped silicon, conductively-doped germanium, conductively-doped silicon germanium, etc.), polysilicon, other materials exhibiting electrical conductivity, or a combination thereof. In some embodiments, the contact plug 160 is formed of polysilicon. The pillars 105 and contact plugs 160 are formed on pitch (e.g., exhibit the same pitch). An upper surface of the contact plug 160 may be substantially coplanar with an upper surface of the uppermost tier 120. The contact plug 160 may be operably coupled (e.g., electrically connected) to other conductive materials of the electronic device 100, such as being electrically connected to contacts (not shown) above the upper deck 110B.

The pillars 105 of the electronic device 100 include the memory pillars 105A/105B, which are operably coupled (e.g., electrically connected) to the source 135, and the dummy pillars 105C, which are not operably coupled (e.g., electrically isolated) to the source 135. The dummy pillars 105C are positioned in the central region of the electronic device 100 and include the oxide material 170 in the central opening 165. The oxide material 170 may be a different material than the dielectric material 130 of the tiers 120 and may be a different material than nitride materials 175 of the tiers 120' (see FIG. 3), so that the nitride materials 175 of the tiers 120' are selectively removable relative to the oxide material 170 during subsequent processing acts. By way of example only, the oxide material 170 may be a lower quality oxide material compared to the quality of an oxide material used as the dielectric material 130 of the tiers 120'. Using the low quality oxide material may enable substantially complete filling of the central opening 165 with the oxide material 170. In some embodiments, the central opening 165 exhibits a substantially U-shape in cross-section, with the sidewalls defined by sloped surfaces of the contact plugs 160 and the fill material 140. The central opening 165 is in the central region of the electronic device 100 and contains the oxide material 170. The oxide material 170 may substantially completely fill the central opening 165 so that the upper surface of the oxide material 170 is substantially coplanar with the upper surface of the contact plugs 160.

An upper portion of the oxide material 170 in the dummy pillars 105C directly contacts the contact plugs 160C and a lower portion of the oxide material 170 in the dummy pillars 105C directly contacts the fill material 140C, with the cell film 150C positioned between the tiers 120 and the fill material 140C. The oxide material 170 directly contacts the contact plug 160C and the fill material 140C, with the cell film 150C directly contacting the fill material 140C. The oxide material 170, therefore, separates the contact plugs 160C and the upper portion of the fill material 140C into two portions. As most clearly illustrated in FIG. 2, the two portions of the contact plug 160C are separated by the oxide material 170, which extends substantially continuously in the y-direction between adjacent dummy pillars 105C. The two portions of the fill material 140C in the upper deck 110B are also separated by the oxide material 170. The oxide material 170 is, therefore, configured as a substantially continuous (e.g., not segmented) material extending between the two portions of the contact plugs 160C of the adjacent dummy pillars 105C. The oxide material 170 functions to electrically isolate the contact plugs 160C of the dummy pillars 105C from the source 135. The dummy pillars 105C also provide mechanical support to the electronic device 100. The oxide material 170 in the central opening 165 may also protect the fill material 140 of the dummy pillars 105C from being removed. Since the oxide material 170 is directly adjacent to (e.g., directly contacts) the fill material 140 and the contact plugs 160C and covers exposed surfaces of the fill material 140 and the contact plugs 160C, the oxide material 170 prevents the removal of the fill material 140 of the dummy pillars 105C during subsequent process acts.

The conductive materials 125 of the electronic device 100 may be formed of one of the electrically conductive material previously discussed. In some embodiments, the conductive material 125 is tungsten. The conductive materials 125 may be operatively coupled to electrically conductive structures, such as to the contact plugs 160 and the source 135. The conductive materials 125 may also provide electrical access to other electrically conductive components of the electronic device 100, which may include, but are not limited to, data lines (e.g., bit lines, select lines), contacts, interconnects, routing structures, CMOS circuitry, or other electrically conductive components vertically above the upper deck 110B or vertically below the lower deck 110A. By way of example only, the conductive materials 125 may electrically connect the source 135 to other electrically conductive components of the electronic device 100. The conductive materials 125 of the tiers 120 may, for example, be configured as access lines (e.g., word lines, gates) of the electronic device 100. As described below, the conductive materials 125 are formed in place of nitride materials 175 (see FIG. 3) of an electronic structure 100' by a so-called "replacement gate" process.

The dielectric materials 130 may be an electrically insulative material including, but not limited to, a silicon oxide (e.g., silicon dioxide ($SiO_2$)), phosphosilicate glass, borosilicate glass, borophosphosilicate glass, fluorosilicate glass, or a combination thereof. In some embodiments, the dielectric material 130 is silicon dioxide. The dielectric material 130 may, for example, be configured to electrically isolate the conductive materials 125 of the electronic device 100 from one another and from other conductive components (e.g., additional components vertically above the upper deck 110B or vertically below the lower deck 110A) of the electronic device 100. The dielectric materials 130 of the tiers 120 are positioned between the conductive materials 125 of the tiers 120.

The electronic device 100 also includes the source 135 adjacent to (e.g., vertically adjacent to, on) the substrate 115. The source 135 may be formed of one of the electrically conductive material previously discussed. In some embodiments, the source 135 is formed of doped polysilicon. In other embodiments, the source 135 is formed of tungsten silicide. The source 135 is operably coupled to the pillars 105A/105B but is isolated from the dummy pillars 105C. The channel material of the pillars 105A/105B is in electrical contact with the source 135.

The electronic device 100 according to embodiments of the disclosure includes multiple memory cells. Intersections between the conductive materials 125 of the tiers 120 and the channel material of the memory pillars 105A/105B define each memory cell and the pillars 105A/105B comprise strings of memory cells. The electronic device 100 may, for example, be a memory device that includes multiple memory planes, each of which may include memory blocks. As shown in FIGS. 1 and 2, the electronic device 100 includes nine pillars 105, with eight memory pillars 105A/105B and one dummy pillar 105C. The pillars 105 are arranged in a block (e.g., a memory block) that includes multiple subblocks (e.g., memory subblocks). However, more pillars 105 or less pillars 105 may by present in the block and other configurations of pillars 105 are contemplated in the block. The electronic device 100 of FIGS. 1 and 2 includes four pillars 105A/105B, which are active, on each side of the dummy pillars 105C. The central opening 165 containing the oxide material 170 forms two subblocks separated from one another, with each subblock containing the four pillars 105A/105B. The dummy pillars 105C in the central region of the block enables each subblock to be separately controlled. The electronic device 100 according to embodiments of the disclosure may include, but is not limited to, a 3D electronic device, such as a 3D NAND Flash memory device, (e.g., a multideck 3D NAND Flash memory device). However, the electronic device 100 according to embodiments of the disclosure may be used in other memory device having multiple decks and in which electrical isolation between adjacent subblocks is desired.

Accordingly, an electronic device is disclosed and comprises a lower deck and an upper deck adjacent to a source. Each of the lower deck and the upper deck comprise tiers of alternating conductive materials and dielectric materials. Memory pillars in the lower deck and in the upper deck are configured to be operably coupled to the source. The memory pillars comprise contact plugs in the upper deck, cell films in the lower deck and in the upper deck, and fill materials in the lower deck and in the upper deck. The cell films in the upper deck are adjacent to the contact plugs and the fill materials in the upper deck are adjacent to the contact plugs. Dummy pillars are in a central region of the lower deck and the upper deck. The dummy pillars comprise an oxide material in the upper deck, the oxide material contacting the contact plugs and the fill materials.

Accordingly, another electronic device is disclosed and comprises memory pillars and dummy pillars in decks of the electronic device. The memory pillars are configured to be operably coupled to a source. The dummy pillars are in a central region of the decks and comprise an oxide material in an upper portion of the dummy pillars. The oxide material comprises a substantially continuous material extending between adjacent dummy pillars in the central region.

Figure 3:
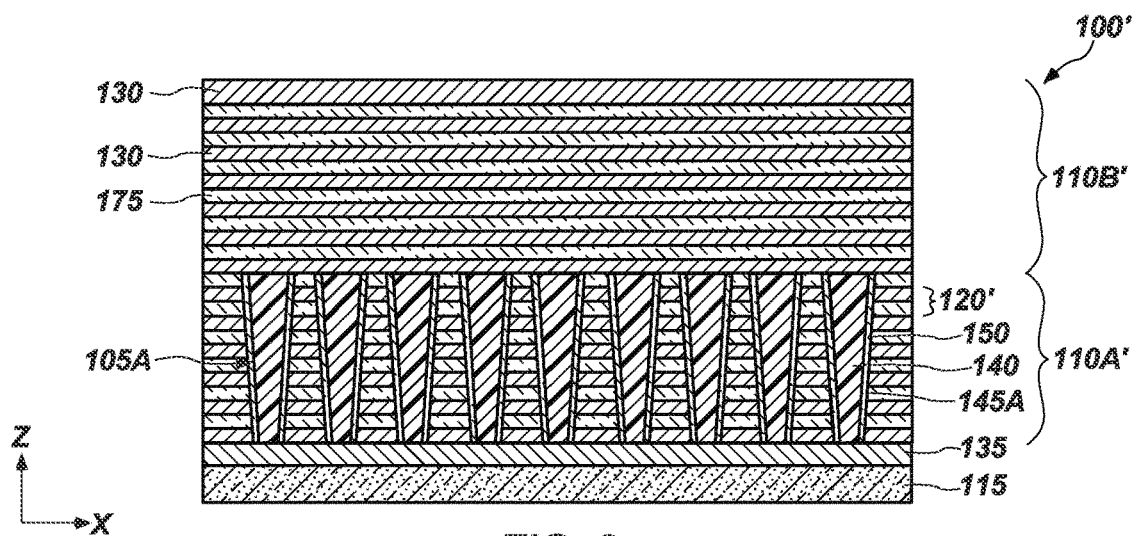
FIGS. 3-5 are cross-sectional views of an electronic structure at various stages of forming the electronic device according to embodiments of the disclosure.

The electronic device 100 is formed from an electronic structure 100' in which nitride materials 175 are present in place of the conductive materials 125 of FIGS. 1 and 2. To form the electronic device of FIGS. 1 and 2, a conductive material of the source 135 is formed adjacent to (e.g., on) the substrate 115, as shown in FIG. 3, which illustrates the electronic structure 100' at an initial processing stage. The source 135 is formed vertically adjacent to the substrate 115 by conventional techniques. Alternating nitride materials 175 and dielectric materials 130 of the tiers 120' of the lower deck 110A are formed adjacent to (e.g., vertically adjacent to, on) the source 135 by conventional techniques. The nitride materials 175 and dielectric materials 130 may, for example, by formed by ALD or CVD. The nitride materials 175 of the electronic structure 100' may, for example, be silicon nitride.

After forming the desired number of tiers 120', the alternating nitride materials 175 and dielectric materials 130 of the lower deck 110A' are patterned to form lower pillar openings 145A, into which the channel material and the cell materials of the lower pillars 105A are formed. The lower pillar openings 145A are selectively formed in the tiers 120' of the lower deck 110A' by conventional photolithography techniques and extend through the lower deck 110A'. The lower pillar openings 145A may optionally extend into the source 135, or may optionally extend through the source 135 and into the substrate 115. The lower pillar openings 145A are formed by removing materials of the tiers 120' and, optionally, of the source 135 and the substrate 115. One or more etch processes may be conducted to form the lower pillar openings 145A. The channel material and the cell materials are conformally formed on sidewalls of the nitride materials 175 and dielectric materials 130 and the fill material 140 is formed in the remaining portions of the lower pillar openings 145A. The fill material 140 substantially completely fills the lower pillar openings 145A, forming the lower pillars 105A. The lower pillars 105A are formed in the lower deck 110A substantially on pitch.

Figure 4:
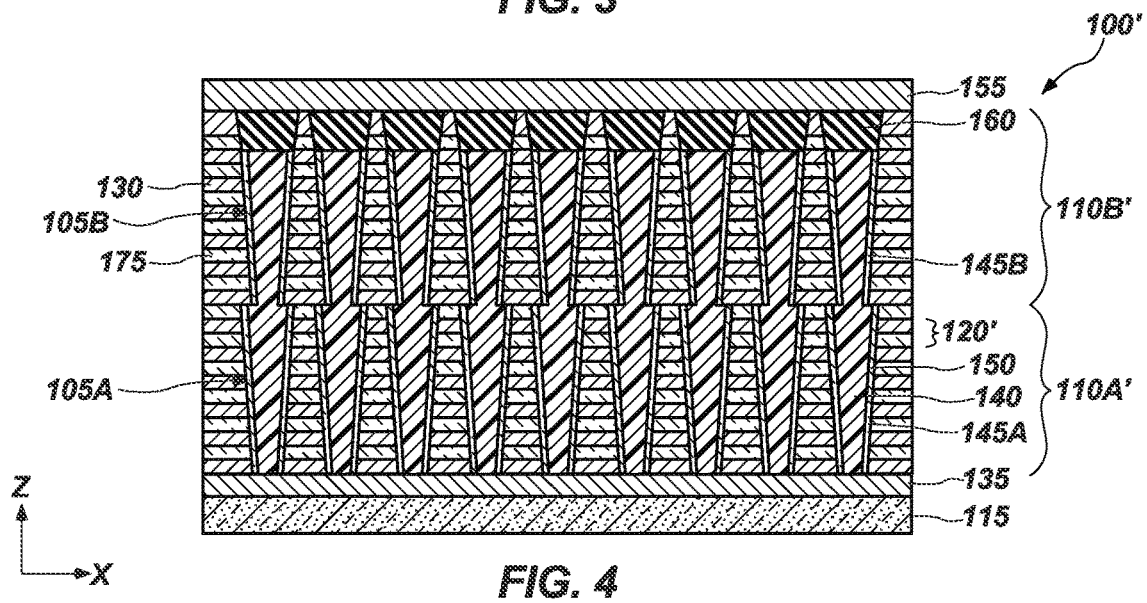

Alternating nitride materials 175 and dielectric materials 130 of the tiers 120' of the upper deck 110B' are formed adjacent to (e.g., vertically adjacent to, on) the lower deck 110A', as shown in FIG. 3. The lower deck 110A' and the upper deck 110B' may include the same number of tiers 120' as one another or a different number of tiers 120'. Upper pillar openings 145B are formed in the upper deck 110B' by conventional techniques and extend through the upper deck 110B', as shown in FIG. 4. The channel material, the cell materials, the fill material 140, and a conductive material of the contact plugs 160 are formed in the upper pillar openings 145B to form the upper pillars 105B. The upper pillars 105B are formed in the upper deck 110B' substantially on pitch and are substantially aligned with the lower pillars 105A of the lower deck 110A'. The channel material and the cell materials are formed in the upper pillar openings 145B, as described above for the lower pillars 105A, to form the cell films 150 in the upper deck 110B'. The channel material and the cell materials are conformally formed on sidewalls of the tiers 120' and the fill material 140 is formed in the remaining portions of the upper pillar openings 145B. A portion of the fill material 140 and cell film 150 is removed, recessing an upper surface of the fill material 140 and cell film 150 in the upper pillar openings 145B. The conductive material of the contact plugs 160 is formed over the fill material 140 and cell film 150. Excess conductive material of the contact plugs 160 may be removed by conventional techniques such that the upper surface of the contact plugs 160 is substantially coplanar with the uppermost tier 120' of the upper deck 110B. At this processing stage, the contact plugs 160 and the cell films 150 are electrically connected to the source 135.

A sacrificial material 155 is formed adjacent to (e.g., vertically adjacent to, on) the uppermost tier 120' of the electronic structure 100' by conventional techniques. The sacrificial material 155 may be a dielectric material, such as an oxide dielectric material. The sacrificial material 155 may be formed at a thickness of from about 50 nm to about 200 nm, such as from about 75 nm to about 125 nm. The sacrificial material 155 may function as a mask to protect underlying materials during subsequent process acts to form the central opening 165 in the contact plugs 160 and fill materials 140.

Figure 5:
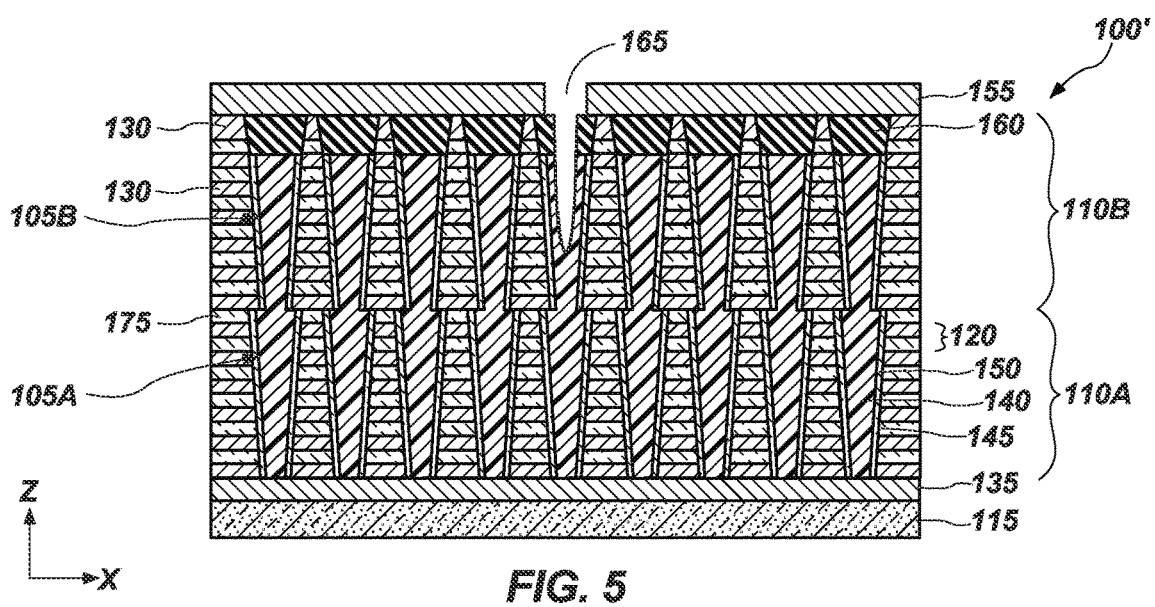

As shown in FIG. 5, the central opening 165 is formed and extends through the sacrificial material 155, through the contact plugs 160, and into the fill material 140 of the upper pillars 105B. The central opening 165 runs in a direction (the y-direction) substantially parallel to an opening (e.g., a slit) (not shown) through which the replacement gate process is subsequently conducted. The central opening 165 is formed in one or more pillars 105C in the central region of the electronic structure 100'. The central opening 165 may extend in a vertical direction (the y-direction) at least partially into the fill material 140. By way of example only, the central opening 165 may extend between three tiers 120' and about five tiers 120' into the upper deck 110B. A portion of the contact plug 160C may be removed by a first etch act, and an underlying portion of the fill material 140C may be removed by a second etch act to form the central opening 165 in the upper deck 110B. The central opening 165 exhibits a shape into which the oxide material 170 may subsequently be formed without forming voids therein. The resulting shape of the central opening 165 is determined by appropriately selecting etchants used in the first and second etch acts. Sidewalls of the central opening 165 are defined by remaining portions of the contact plugs 160 and the fill material 140 after conducting the first and second etch acts. As shown in FIG. 5, the central opening 165 may exhibit a U-shape in cross-section, with sidewalls thereof defined by the remaining portions of the contact plugs 160 and the fill material 140. The sidewalls defined by the contact plugs 160 and the fill material 140 may be sloped to enable the oxide material 170 to be formed therein without forming voids in the oxide material 170. Voids, if present, may undesirably become filled with the conductive material 125 following the subsequently-conducted replacement gate process.

The oxide material 170 may be formed in the central opening 165, substantially completely filling the central opening 165 to form the electronic device 100 of FIGS. 1 and 2. Since the oxide material 170 is a low quality oxide material compared to the quality of an oxide material used as the dielectric material 130 of the tiers 120', the central opening 165 may be substantially completely filled with the oxide material 170. Excess oxide material 170 may be removed by conventional techniques, such as by chemical-mechanical planarization, such that the upper surface of the oxide material 170 in the central opening 165 is substantially coplanar with the upper surface of the uppermost tier 120'. In some embodiments, the central opening 165 exhibits a U-shape in cross-section, with the sidewalls defined by sloped surfaces of the contact plugs 160 and the fill material 140. However, the central opening 165 may be defined by substantially vertical sidewalls of the contact plugs 160 and the fill material 140 so long as the oxide material 170 may be formed therein without forming voids in the oxide material 170. The oxide material 170 may be a different material than the sacrificial material 155, enabling selective removal of the sacrificial material 155 during a subsequent process act. The presence of the oxide material 170 in the central opening 165 changes the configuration of the pillars 105 in the central region to dummy pillars 105C since the oxide material 170 electrically isolates the contact plugs 160 and the cell films 150 from an underlying portion of the source 135. However, the contact plugs 160 and the cell films 150 of other pillars 105A/105B remain operatively connected (e.g., electrically connected) to the source 135. The upper portion of the oxide material 170 separates the contact plug 160C into two portions on opposing surfaces of the oxide material 170 and the lower portion of the oxide material 170 separates the fill material 140C into two portions on opposing surfaces of the oxide material 170. The oxide material 170 directly contacts the two portions of the contact plug 160C and the fill material 140C. The oxide material 170 of the dummy pillars 105C is present in the central region of the electronic device 100 and functions to electrically isolate one subblock (e.g., memory subblock) of the electronic device 100 from another (e.g., an adjacent) subblock of the electronic device.

Additional processing acts may be conducted by conventional techniques to form the electronic device 100 from the electronic structure 100'. For instance, after removing the sacrificial material 155, the replacement gate process is conducted by conventional techniques to form the electronic device 100 of FIGS. 1 and 2. In the replacement gate process, the nitride materials 175 of the tiers 120' of the electronic structure 100' are replaced with the conductive materials 125 to form the electronic device 100 containing the pillars 105A/105B, the dummy pillars 105C, the decks 110A, 110B, the conductive materials 125, the dielectric materials 130, the fill materials 140, the cell films 150, the contact plugs 160, the oxide material 170, the source 135, and the substrate 115, as shown in FIGS. 1 and 2. The nitride materials 175 of the tiers 120' are selectively etchable relative to the dielectric materials 130 of the tiers 120' and to the fill material 140. The nitride materials 175 are removed (e.g., etched) through a slit (not shown) in the tiers 120' using conventional etchants. After removing the nitride materials 175, the conductive materials 125 are formed in spaces (not shown) between the dielectric materials 130. The conductive materials 125 are formed by conventional techniques. After the replacement gate process, the electronic device 100 includes the tiers 120 of alternating conductive materials 125 and dielectric materials 130, with the conductive materials 125 in locations previously occupied by the nitride materials 175 of the tiers 120'. The nitride materials 175 are also selectively etchable relative to the oxide material 170 during the replacement gate process. Therefore, the oxide material 170 remains in the central opening 165 during the replacement gate process, preventing conductive material 125 from forming in the central opening 165 and maintaining the dummy pillars 105C in the central region of the electronic device 100. The oxide material 170 in the central opening 165 also protects the fill material 140 of the dummy pillars 105C from being removed. Therefore, the dummy pillars 105C exhibit critical dimensions (CDs) that are substantially the same as CDs of the memory pillars 105A/105B. Since the oxide material 170 is directly adjacent to (e.g., directly contacts) the fill material 140 and the contact plugs 160C and covers the exposed surfaces of the fill material 140 and the contact plugs 160C, the oxide material 170 prevents the removal of the fill material 140 of the dummy pillars 105C.

Figure 6:
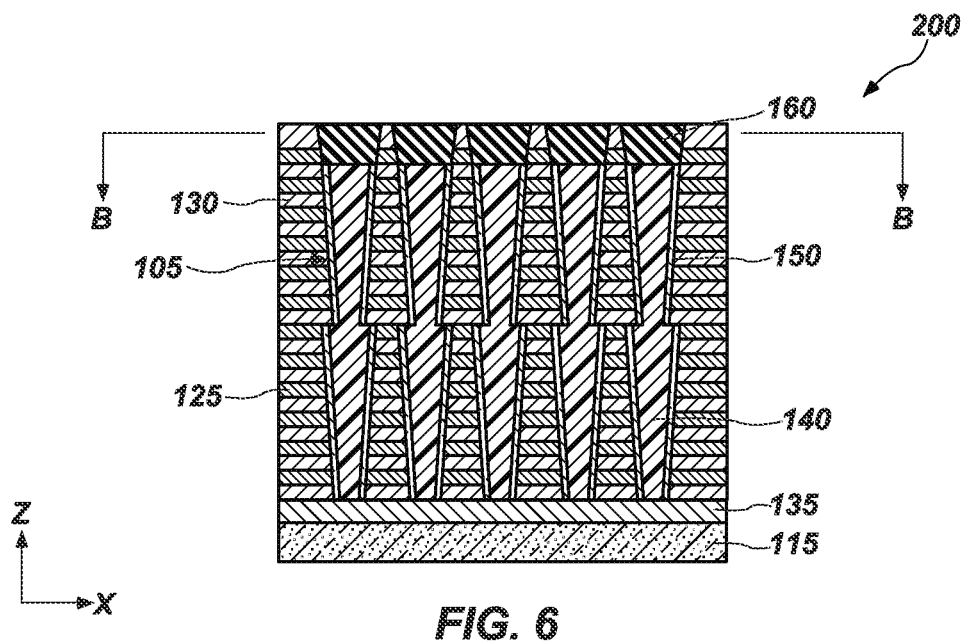
FIG. 6 is a cross-sectional view of a conventional electronic device including memory pillars and dummy pillars at a similar processing stage as that of FIG. 1.
Figure 7:
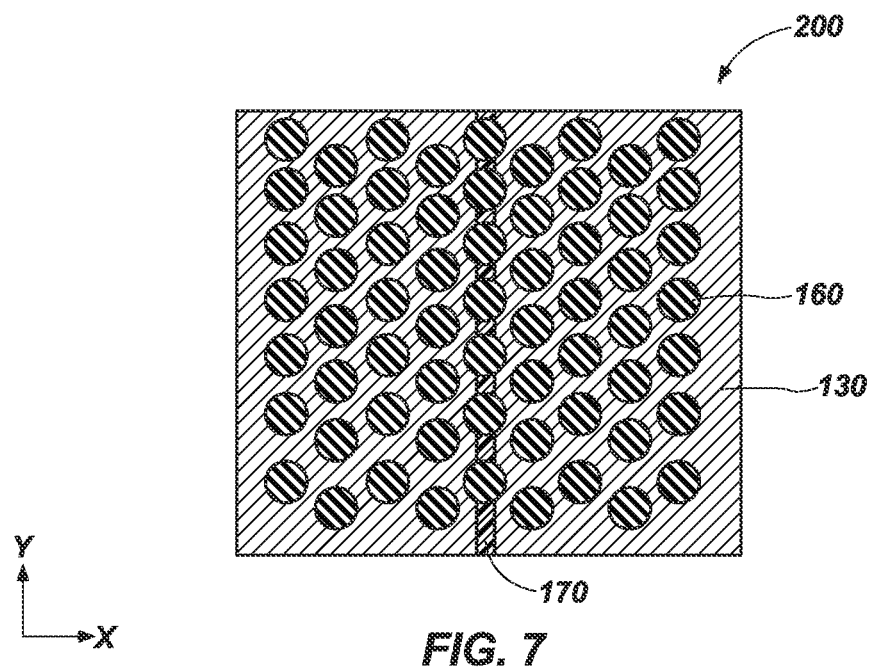
FIG. 7 is a top down view of the conventional electronic device of FIG. 6 taken along the B-B line.

In contrast, a portion of the fill material in conventional electronic devices is exposed during a corresponding stage of the fabrication process and may be removed during subsequent process acts, leading to a larger CD of its dummy pillars compared to the CD of the memory pillars. The larger CD of the dummy pillars in the conventional electronic devices leads to bridging and twisting of the dummy pillars and memory pillars of the conventional electronic devices. As shown in FIGS. 6 and 7, which are cross-sectional and top-down views of conventional electronic devices 200 at a similar stage of the fabrication process as FIGS. 1 and 2, the oxide material 170 is not configured in the y-direction as a substantially continuous material over dummy pillars. Rather, the oxide material 170 is separated (e.g., segmented) into portions. Furthermore, the oxide material 170 does not separate the contact plugs 160 into portions. In the fabrication process of conventional electronic devices, the cell films, fill materials, and contact plugs are formed in the upper decks after forming the oxide material in the central region, which results in the oxide material being segmented.

While FIGS. 1-5 illustrate the formation of the electronic device 100 from the electronic structure 100' by the replacement gate process, the electronic device 100 may alternatively be formed by a so-called "gate first" process in which the electronic structure 100' includes tiers 120 having alternating conductive materials 125 and dielectric materials 130 rather than alternating nitride materials 175 and dielectric materials 130. For instance, the tiers 120 having alternating conductive materials 125 and dielectric materials 130 are present in the electronic structure 100' at the initial processing stage shown in FIG. 3. The upper pillars 105B, the contact plugs 160, the sacrificial material 155, the central opening 165 and the oxide material 170 are subsequently formed as described above for FIGS. 3-5.

Accordingly, a method of forming an electronic device is disclosed. The method comprises forming a lower deck comprising lower pillars in tiers of alternating nitride materials and dielectric material adjacent to a source. An upper deck comprising additional tiers of alternating nitride materials and dielectric materials is formed adjacent to the lower deck. Pillar openings are formed in the upper deck and upper pillars are formed in the pillar openings. The upper pillars comprise contact plugs, cell films, and fill materials. A portion of the contact plugs and fill materials is removed from the upper pillars in a central region of the upper deck to form central openings. An oxide material is formed in the central openings of the central region of the upper deck and the nitride materials of the tiers and of the additional tiers are replaced with conductive materials.

Figure 8:
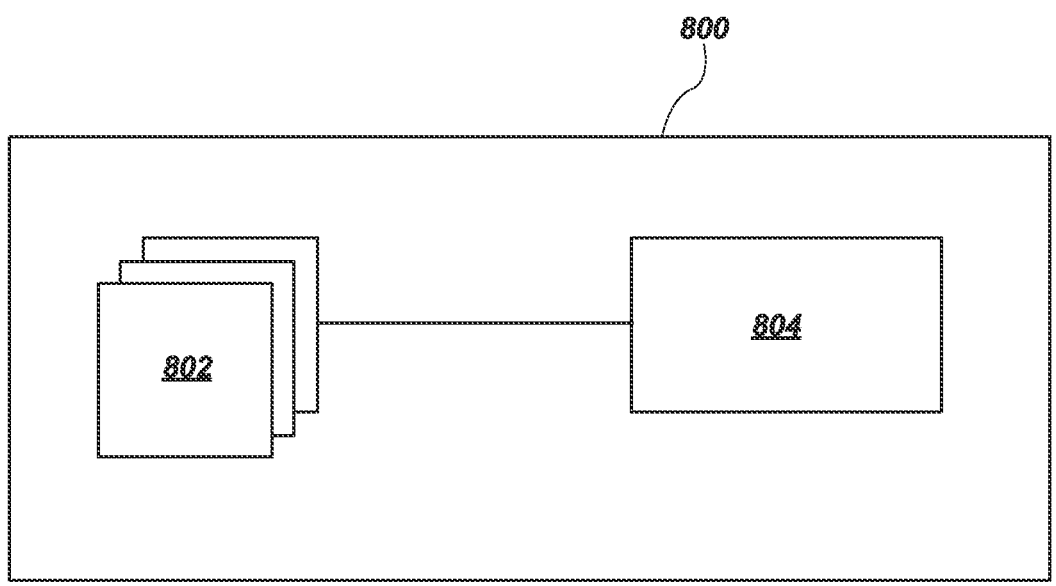
FIG. 8 is a block diagram of a memory array including one or more electronic devices according to embodiments of the disclosure.

Additional processing acts are also conducted to form a memory array or system containing one or more electronic devices 100. The electronic device 100 may be present in a memory array 800, as shown schematically in FIG. 8. The memory array 800 includes memory cells 802 and a control logic component 804. The control logic component 804 may be configured to operatively interact with the memory cells 802 so as to read, write, or re-fresh any or all memory cells within the memory array of memory cells 802. The memory cells 802 of the memory array 800 are coupled to access lines, and the access lines are coupled to word lines (e.g., conductive materials 125) of the memory cells 802. A string of memory cells of the memory array 800 is coupled in series between the source 135 and a data line (e.g., a bit line). The memory cells 802 are positioned between the word lines and the data lines. The access lines may be in electrical contact with, for example, the conductive materials 125 of the electronic device 100, and the data lines may be in electrical contact with an electrode (e.g., a top electrode) of the electronic device 100. The data lines may directly overlie a row or column of the memory cells 802 and contact the top electrode thereof. Each of the access lines may extend in a first direction and may connect a row of the memory cells 802. Each of the data lines may extend in a second direction that is at least substantially perpendicular to the first direction and may connect a column of the memory cells 802. A voltage applied to the access lines and the data lines may be controlled such that an electric field may be selectively applied at an intersection of at least one access line and at least one bit line, enabling the memory cells 802 to be selectively operated. Additional process acts to form the memory array 800 including the one or more electronic devices 100 are conducted by conventional techniques.

Figure 9:
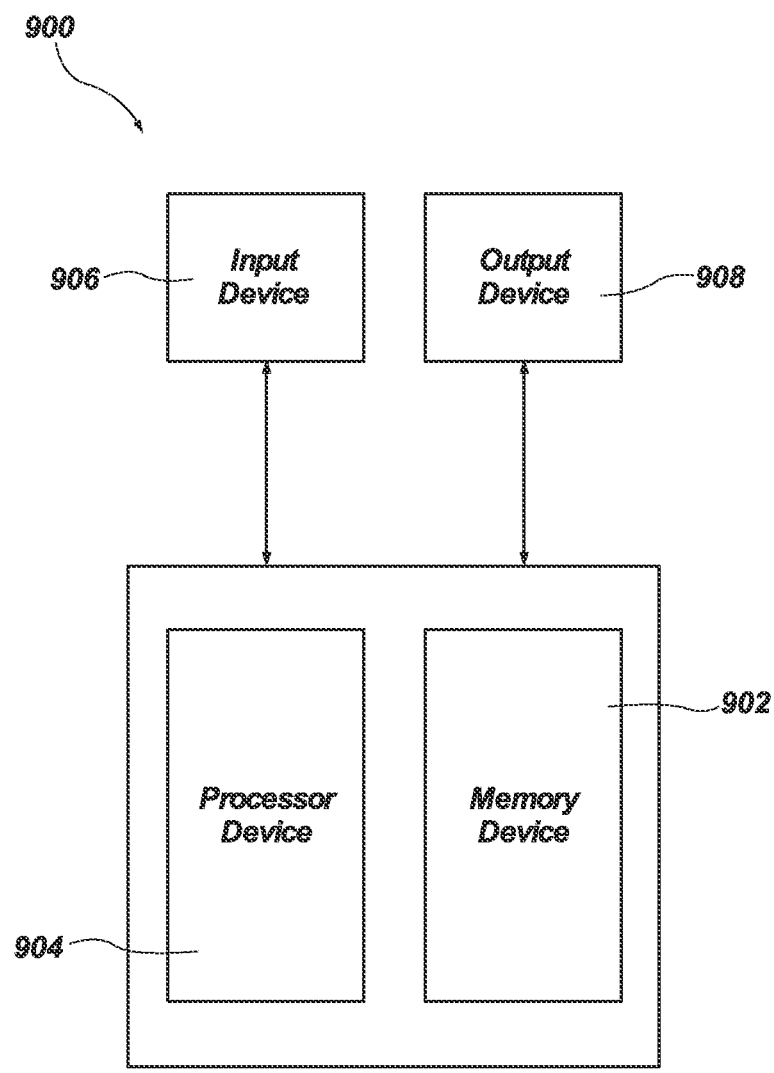
FIG. 9 is a block diagram of a system including one or more of the electronic devices according to embodiments of the disclosure.

FIG. 9 is a block diagram of a system 900 (e.g., an electronic system) implemented according to one or more embodiments described herein. The system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The system 900 includes at least one memory device 902, which includes one or more electronic devices 100 as previously described. The system 900 may further include at least one processor 904, such as a microprocessor, to control the processing of system functions and requests in the system 900. The processor 904 and other subcomponents of the system 900 may include the memory cells. The processor 904 may, optionally, include one or more memory arrays 800 as previously described.

Various other devices may be coupled to the processor 904 depending on the functions that the system 900 performs. For example, an input device 906 may be coupled to the processor 904 for inputting information into the system 900 by a user, such as, for example, a mouse or other pointing device, a button, a switch, a keyboard, a touchpad, a light pen, a digitizer and stylus, a touch screen, a voice recognition system, a microphone, a control panel, or a combination thereof. An output device 908 for outputting information (e.g., visual or audio output) to a user may also be coupled to the processor 904. The output device 908 may include an LCD display, an SED display, a CRT display, a DLP display, a plasma display, an OLED display, an LED display, a three-dimensional projection, an audio display, or a combination thereof. The output device 908 may also include a printer, an audio output jack, a speaker, etc. In some embodiments, the input device 906 and the output device 908 may comprise a single touchscreen device that can be used both to input information to the system 900 and to output visual information to a user. The one or more input devices 906 and output devices 908 may communicate electrically with at least one of the memory device 902 and the processor 904. The at least one memory device 902 and processor 904 may also be used in a system on chip (SoC).

Accordingly, a system comprising an input device, an output device, a processor device, and at least one memory device is disclosed. The at least one memory device is operably coupled to the processor device and comprises memory pillars and dummy pillars in decks of the at least one memory device. The memory pillars comprise contact plugs and cell films operably coupled to a source. The dummy pillars comprise an oxide material in an upper portion thereof and the oxide material isolates conductive portions of the dummy pillars from the source.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
a lower deck and an upper deck adjacent to a source, each of the lower deck and the upper deck comprising tiers of alternating conductive materials and dielectric materials;
memory pillars in the lower deck and in the upper deck, the memory pillars configured to be operably coupled to the source and comprising:
contact plugs in the upper deck;
cell films in the lower deck and in the upper deck, the cell films in the upper deck adjacent to the contact plugs; and
fill materials in the lower deck and in the upper deck, the fill materials in the upper deck adjacent to the contact plugs; and
dummy pillars in a central region of the lower deck and the upper deck, the dummy pillars comprising contact plugs and an oxide material in the upper deck, the oxide material separating the contact plugs of the dummy pillars into two portions.

2. The electronic device of claim 1, wherein the oxide material of the dummy pillars directly contacts the contact plugs.

3. The electronic device of claim 1, wherein the oxide material of the dummy pillars directly contacts the fill material.

4. The electronic device of claim 1, wherein the dummy pillars exhibit a critical dimension that is substantially the same as a critical dimension of the memory pillars.

5. The electronic device of claim 1, wherein the oxide material of the dummy pillars comprises a different material composition than the dielectric materials of the tiers.

6. The electronic device of claim 1, wherein an upper surface of the oxide material is substantially coplanar with an upper surface of the contact plugs.

7. An electronic device, comprising:
memory pillars in an array region comprising tiers of alternating conductive materials and dielectric materials, the memory pillars configured to be operably coupled to a source and comprising:
contact plugs in an upper deck of the array region;
cell films in a lower deck of the array region and in the upper deck, the cell films in the upper deck adjacent to the contact plugs; and
fill materials in the lower deck and in the upper deck, the fill materials in the upper deck adjacent to the contact plugs; and
dummy pillars in a central region of the array region, the dummy pillars comprising contact plugs and an oxide material in the upper deck, the oxide material between portions of the contact plugs of the dummy pillars.

8. The electronic device of claim 7, wherein the oxide material of the dummy pillars is substantially free of voids.

9. The electronic device of claim 7, wherein the oxide material of the dummy pillars extends continuously in a direction perpendicular to the tiers.

10. The electronic device of claim 7, wherein adjacent contact plugs of the dummy pillars in the central region are separated from one another by the conductive materials of the tiers.

11. The electronic device of claim 7, wherein the oxide material separates the fill materials of the dummy pillars into two portions.

12. The electronic device of claim 7, wherein the oxide material of the dummy pillars extends into between three tiers and five tiers of the upper deck.

13. An electronic device, comprising:
- memory pillars in decks of an electronic device, the memory pillars configured to be operably coupled to a source; and
- dummy pillars in a central region of the decks, the dummy pillars comprising contact plugs, an oxide material, and fill materials in an upper portion of the dummy pillars, the oxide material adjacent to the contact plugs and separating the contact plugs into portions.

14. The electronic device of claim 13, wherein the dummy pillars in the central region are configured to electrically isolate a subblock of the electronic device from an adjacent subblock of the electronic device.

15. The electronic device of claim 13, wherein an upper surface of the oxide material is substantially coplanar with an upper surface of an uppermost tier of the deck.

16. The electronic device of claim 13, wherein the oxide material directly contacts the contact plugs of the dummy pillars and directly contacts the fill materials of the dummy pillars.

17. The electronic device of claim 13, wherein the oxide material of the dummy pillars extends continuously between adjacent contact plugs of the dummy pillars.

18. The electronic device of claim 13, wherein the oxide material of the dummy pillars extends continuously in the central region.

19. The electronic device of claim 13, wherein the memory pillars lack an oxide material separating the contact plugs into portions.

20. The electronic device of claim 13, wherein the oxide material of the dummy pillars electrically isolates the dummy pillars from the source.

* * * * *

UNITED STATES PATENT AND TRADEMARK OFFICE
CERTIFICATE OF CORRECTION

PATENT NO. : 12,041,775 B2
APPLICATION NO. : 17/933227
DATED : July 16, 2024
INVENTOR(S) : S M Istiaque Hossain et al.

Page 1 of 1

It is certified that error appears in the above-identified patent and that said Letters Patent is hereby corrected as shown below:

In the Specification
Column 1, Line 11, change "Oct. 24, 2022," to --Oct. 25, 2022,--
Column 6, Line 26, change "memory device) or" to --memory device,) or--

Signed and Sealed this
Twenty-seventh Day of August, 2024

Katherine Kelly Vidal
*Director of the United States Patent and Trademark Office*